(12) United States Patent
Yamada

(10) Patent No.: US 10,546,935 B2
(45) Date of Patent: Jan. 28, 2020

(54) SEMICONDUCTOR DEVICE

(71) Applicant: SUMITOMO ELECTRIC DEVICE INNOVATIONS, INC., Yokohama-shi, Kanagawa (JP)

(72) Inventor: Fumio Yamada, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/169,826

(22) Filed: Oct. 24, 2018

(65) Prior Publication Data

US 2019/0123152 A1 Apr. 25, 2019

(30) Foreign Application Priority Data

Oct. 24, 2017 (JP) .................. 2017-205093

(51) Int. Cl.
| | |
|---|---|
| *H01L 29/40* | (2006.01) |
| *H01L 29/423* | (2006.01) |
| *H01L 29/778* | (2006.01) |
| *H01L 29/20* | (2006.01) |
| *H01L 29/51* | (2006.01) |
| *H01L 29/78* | (2006.01) |
| *H01L 29/812* | (2006.01) |

(52) U.S. Cl.
CPC ........ *H01L 29/404* (2013.01); *H01L 29/2003* (2013.01); *H01L 29/42316* (2013.01); *H01L 29/51* (2013.01); *H01L 29/7783* (2013.01); *H01L 29/7786* (2013.01); *H01L 29/78* (2013.01); *H01L 29/812* (2013.01)

(58) Field of Classification Search
CPC ......... H01L 29/41725–41791; H01L 29/7839; H01L 29/806; H01L 29/665–66507; H01L 29/7845; H01L 29/404; H01L 29/2003; H01L 29/42316; H01L 29/7786; H01L 29/7783
See application file for complete search history.

(56) References Cited

U.S. PATENT DOCUMENTS

| | | | |
|---|---|---|---|
| 2001/0004124 A1* | 6/2001 | Noda | H01L 29/404 |
| | | | 257/401 |
| 2008/0272443 A1 | 11/2008 | Hoshi et al. | |
| 2010/0230717 A1* | 9/2010 | Saito | H01L 29/0692 |
| | | | 257/140 |
| 2015/0179782 A1* | 6/2015 | Yamamura | H01L 29/205 |
| | | | 257/76 |
| 2015/0194483 A1 | 7/2015 | Kajitani et al. | |
| 2017/0301780 A1* | 10/2017 | Boles | H01L 29/0653 |

FOREIGN PATENT DOCUMENTS

| | | |
|---|---|---|
| JP | 2008-277604 | 11/2008 |
| WO | 2014-050054 | 3/2014 |

* cited by examiner

*Primary Examiner* — Dale E Page
*Assistant Examiner* — Wilner Jean Baptiste
(74) *Attorney, Agent, or Firm* — Smith, Gambrell & Russell, LLP

(57) ABSTRACT

A semiconductor device implementing a field plate is disclosed. The semiconductor device includes electrodes of a source, a gate, and a drain; an insulating film covering at least the drain electrode; a field plate that includes a first part overlapping with the gate electrode and a second part not overlapping with the gate electrode; and a source interconnect connected with the source electrode. A feature of the semiconductor device of the invention is that both of the first part and the second part are electrically connected with the source interconnection.

6 Claims, 8 Drawing Sheets

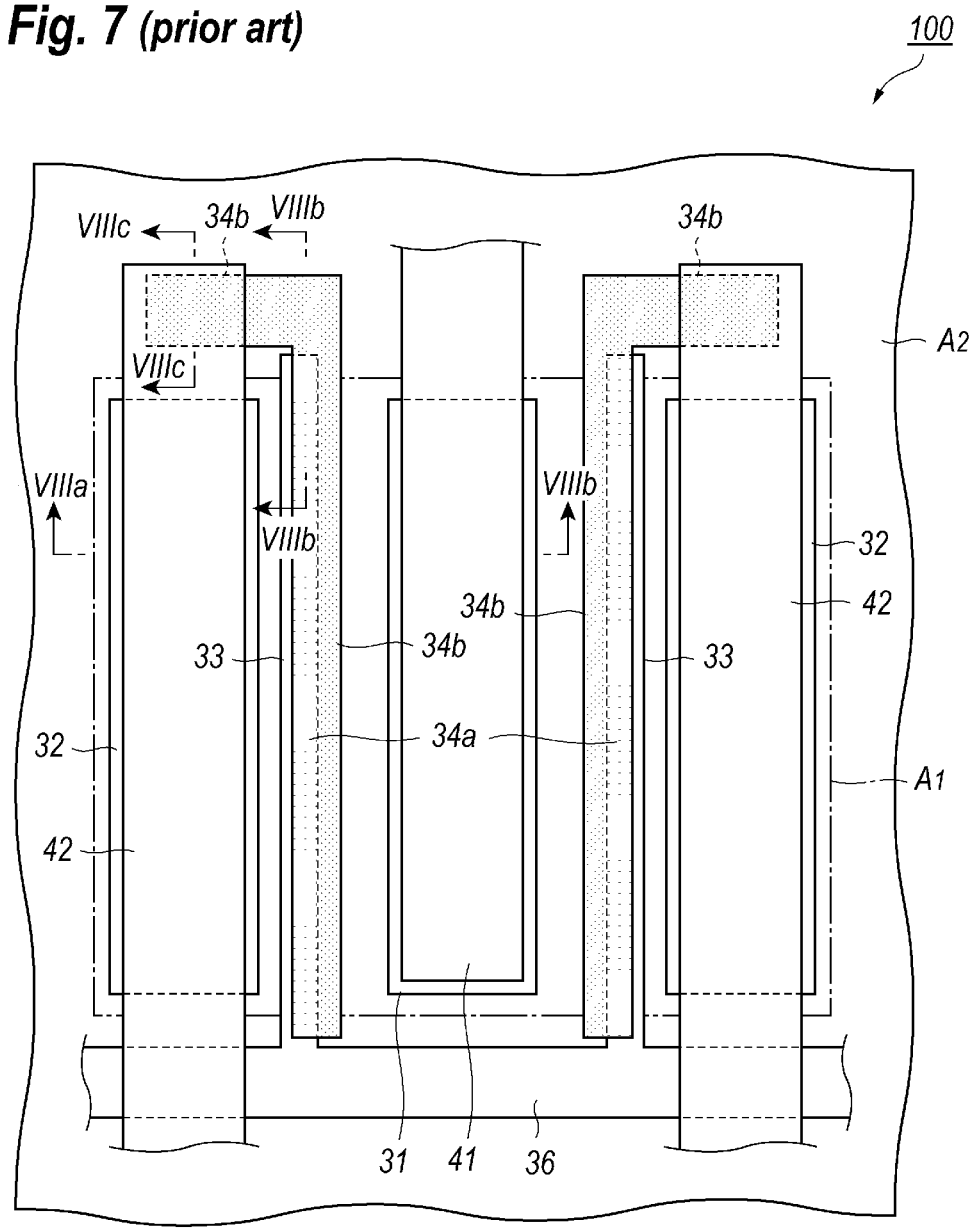
Fig. 7 *(prior art)*

10,546,935 B2

SEMICONDUCTOR DEVICE

CROSS REFERENCE TO RELATED APPLICATIONS

The present application is based on and claims the benefit of priority of Japanese Patent Application No. 2017-205093, filed on Oct. 24, 2017, the entire content of which is incorporated herein by reference.

BACKGROUND OF INVENTION

1. Field of the Invention

The present invention relates to a semiconductor device, in particular, the invention relates to a semiconductor device primarily made of nitride semiconductor materials.

2. Related Prior Arts

A Japanese Patent Application laid open No. JP2008-277604A discloses a semiconductor device type of field effect transistor (FET) having a field plate. A semiconductor device primarily made of nitride semiconductor materials sometimes provides a field plate in order to moderate an electric field induced at an edge of a gate electrode thereof. The field plate generally covers the gate electrode with an insulating film therebetween and may suppress a reduction of a drain current just after hard conditions of a high drain bias concurrently with a deep gate bias are removed, which is often called as the drain current collapsing. A field plate also shields the gate electrode from the drain electrode.

A field plate is generally connected with the source electrode such that the field plate extends to an inactive region that surround an active region of the device and becomes in contact with a source interconnection that extends from the source electrode, where those arrangements of the field plate, the source electrode, and the source interconnection have been disclosed in, for instance, the prior patent document above mentioned. However, a field plate possibly makes a breakage at a step inherently formed by a side of the gate electrode.

SUMMARY OF INVENTION

An aspect of the present invention relates to a semiconductor device that includes electrodes of a source, a drain, and a gate; an insulating film; a field plate: and a source interconnection. Those electrodes extend along a longitudinal direction. The insulating film covers at least the gate electrode and extends between the gate electrode and the drain electrode. The field plate provides a first part overlapping with the gate electrode interposing the insulating film therebetween and a second part not overlapping with the gate electrode and extending on the insulating film between the gate electrode and the drain electrode. The source interconnection is in contact with the source electrode and extends therefrom. A feature of the semiconductor device of the invention is that not only the second part but the first part of the field plate is electrically connected with the source interconnection.

BRIEF DESCRIPTION OF THE DRAWINGS

The foregoing and other purposes, aspects and advantages will be better understood from the following detailed description of a preferred embodiment of the invention with reference to the drawings, in which:

FIG. 3B is taken along the line IIIb-IIIb shown in FIG. 3A;

FIG. 4B is taken along the line IVb-IVb shown in FIG. 4A;

FIG. 5B is taken along the line Vb-Vb shown in FIG. 5A;

FIG. 6B is taken along the line VIb-VIb shown in FIG. 6A;

FIG. 7 is a plan view of a conventional semiconductor device accompanying with a field plate; FIG. 8A to FIG. 8C are taken along the lines, VIIIa-VIIIa, VIIIb-VIIIb and VIIIc-VIIIc, respectively, shown in FIG. 7.

DESCRIPTION OF EMBODIMENT

Figure 1:
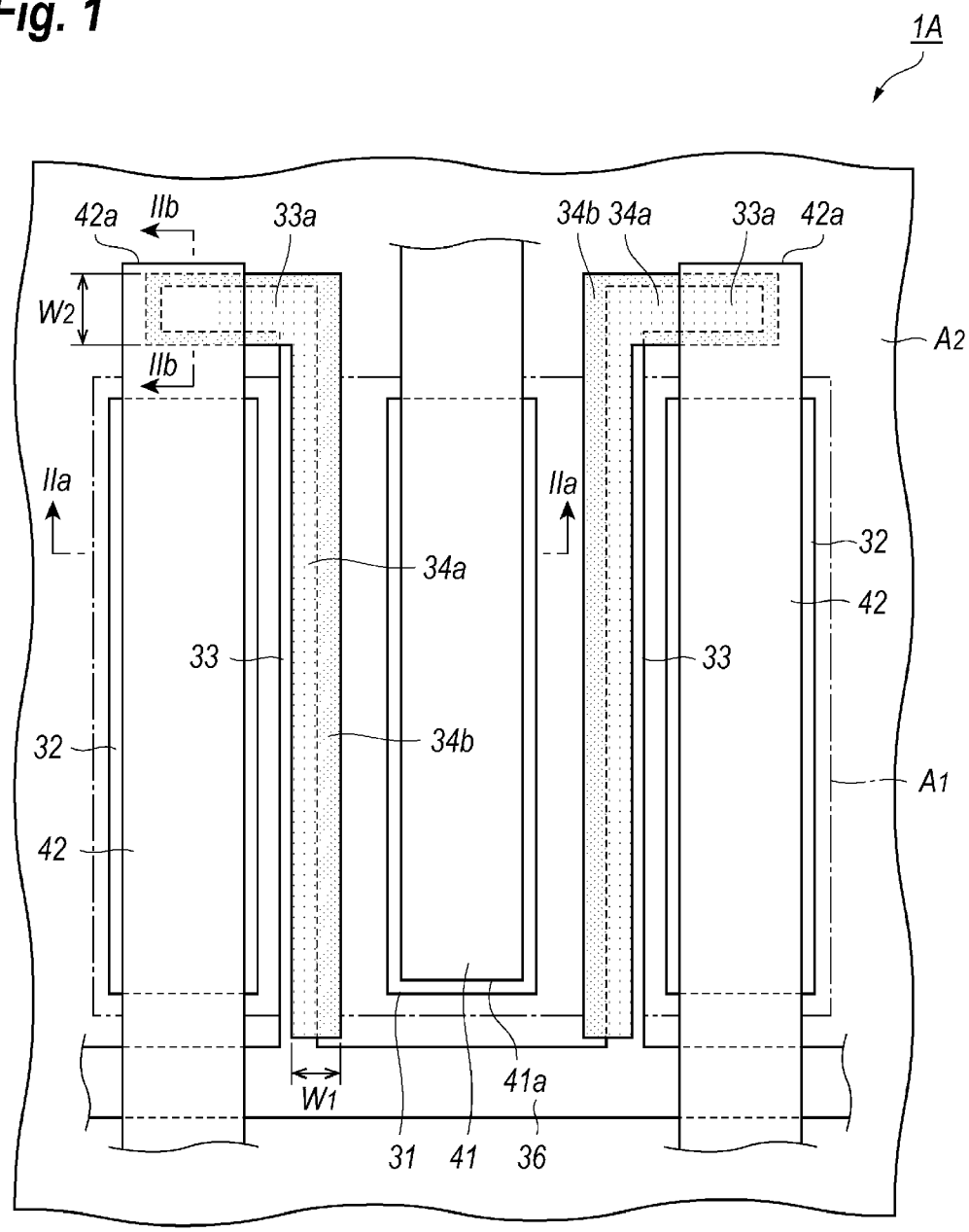
FIG. 1 is a plan view showing a semiconductor device according to embodiment of the present invention.

Next, embodiment according to the present invention will be described referring to accompanying drawings. However, the present invention is not restricted to the embodiment and has a scope defined in claims attached and all changes and modification within the scope and equivalents thereto. In the description of the drawing, numerals or symbols same with or similar to each other will refer to elements same with or similar to each other without duplicating explanations.

Figure 2A:
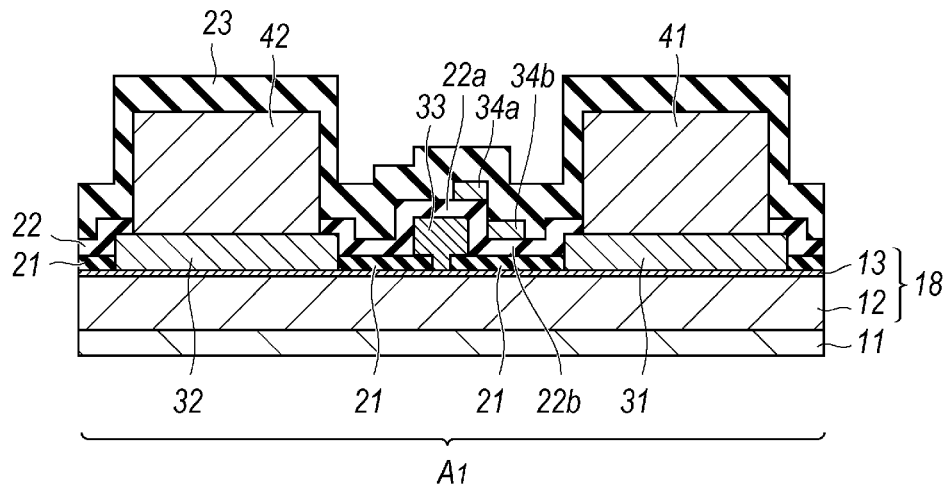
FIG. 2A and FIG. 2B are a cross sectional views of the semiconductor device shown in FIG. 1 taken along the lines IIa-IIa and IIb-IIb indicated in FIG. 1, respectively.
Figure 2B:
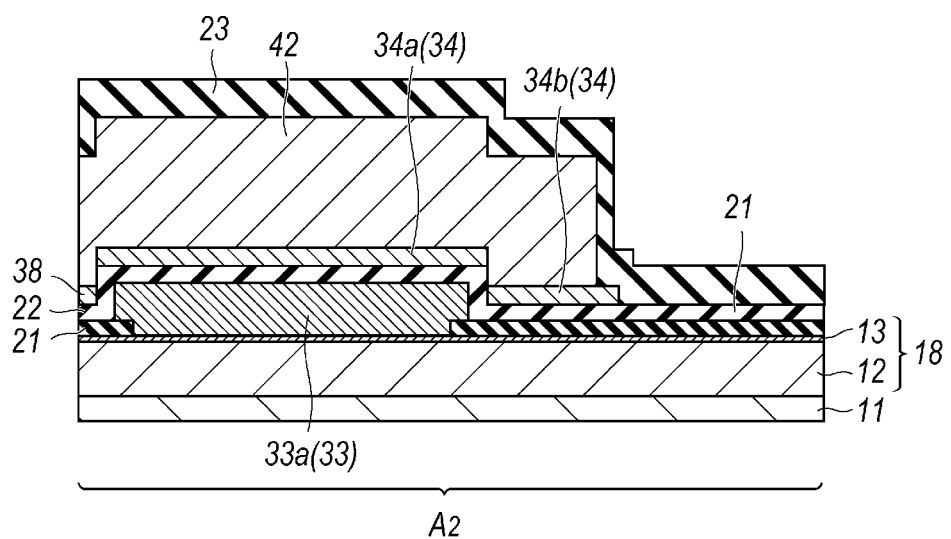

FIG. 1 is a plan view showing a semiconductor device 1A according to embodiment of the present invention, FIG. 2A and FIG. 2B are cross sectional views of the semiconductor device 1A taken along the line IIa-IIa and IIb-IIb, respectively, each indicated in FIG. 1. FIG. 1 omits insulating films, 21 to 23, for simplifying an explanation.

The semiconductor device 1A of the embodiment provides a substrate 11, a semiconductor stack 18 provided on the substrate 11, and electrodes of a drain 31, a source 32, and a gate 33 each provided on the semiconductor stack 18. The substrate 11, which is prepared for epitaxially growing semiconductor layers on a plane primary surface thereof, may be made of silicon carbide (SiC), sapphire ($Al_2O_3$), silicon (Si), diamond (C) and so on. The substrate may have a thickness around 500 µm.

The semiconductor device 1A of the present embodiment, which is a type of field effect transistor (FET), exactly, a type of high electron mobility transistor (HEMT), includes a channel layer 12 and a barrier layer 13 in the semiconductor stack 18, where the channel layer 12 and the barrier layer 13 are epitaxially grown on the substrate 11 and induce a two-dimensional electron gas (2DEG) in the channel layer 12 at an interface against the barrier layer 13. The 2DEG may operate as a channel of the HEMT 1A. The channel layer 12 may be made of gallium nitride (GaN) with a thickness around 1 µm, specifically, 0.5 to 1.2 µm. The barrier layer 13 may be made of, for instance, aluminum gallium nitride (AlGaN), indium aluminum nitride (InAlN), and/or indium aluminum gallium nitride (InAlGaN), with a thickness around 20 nm, specifically, 10 to 30 nm. The present embodiment provides the barrier layer 13 made of $Al_{0.25}Ga_{0.75}N$ with a thickness of 20 nm. The semiconductor stack 18 may further provide a cap layer on the barrier layer 13, where the cap layer may be made of GaN, or n-type GaN, with a thickness around 5 nm.

The semiconductor stack 18 is divided into two portions, one of which is an active region A1, while, the other is inactive region A2 that surrounds the active region A1. The active region A1 may operate as a semiconductor device 1A, while, the inactive region A2 show no functions of carrier transportation; exactly, the inactive region A2, which is formed by implanting argon ions ($Ar^+$) therein to increase resistivity therein. Thus, the inactive region A2 may electrically isolate active regions A1.

The electrodes of the drain 31 and the source 32 are provided in the active region A1 and in contact thereto. The semiconductor device 1A of the embodiment provides one drain electrode 31 and two source electrodes 32 sandwiching the drain electrode 31 therebetween. The electrodes of the drain 31 and the source 32, which have a rectangular plane shape extending respective longitudinal directions, specifically, an up and down direction in FIG. 1, and a type of, what is called, ohmic electrode showing a non-rectified characteristic, are formed by alloying stacked metals of titanium (Ti) with a thickness around 10 nm and aluminum (Al) with a thickness around 300 nm. Another Ti layer with a thickness around 10 nm may cover the Al layer.

The electrodes of the drain 31 and the source 32 may be in contact with the barrier layer 13. In an alternative, the electrodes may be in contact with a cap layer when the semiconductor stack 18 provides a cap layer on the barrier layer 13. In another alternative, the electrodes of the drain 31 and the source 32 may be in contact with the channel layer 12 by removing portions of the barrier layer 13.

The inactive region A2 may provide a drain interconnection 41 that connects semiconductor devices 1A each isolated by the existence of the inactive region A2. The inactive region A2 may also provide source interconnections 42 connecting source electrodes disposed in the respective active regions A1. In the present embodiment, the drain interconnection 41 and the source interconnections 42 extend along the longitudinal direction of the drain electrode 31 and the source electrode 32, and are extracted along the longitudinal direction but opposite directions. That is, the drain interconnection 41 overlaps with the drain electrode 31 and extracted upward in FIG. 1; while, the source interconnections 42 overlap with the source electrodes 32 but extracted downward in FIG. 1. Further specifically, the drain electrode 31 is extracted through the drain interconnection 41 that extends along the longitudinal direction of the drain electrode 31 and crosses at one end of the drain electrode 31 but another end 41a thereof is within the drain electrode 31.

The source electrode 32 is extracted through the source interconnection 42 that extends along the longitudinal direction of the source electrode 32 as crossing at an end of the source electrode 32 but another end 42a of the source interconnection 42 exists in the inactive region A2 to be connected with the field plate 34 thereat. The drain interconnection 41 and the source interconnection 42 may be formed by plating gold (Au) by a thickness of 4 to 6 µm.

The gate electrode 33 extends along the longitudinal direction from the active region A1 to the inactive region A2 in a side of the drain interconnection 41. The present embodiment provides two gate electrodes 33 sandwiching the drain electrode 31 therebetween and put between the drain electrode 31 and the respective source electrodes 32. Thus, the gate electrodes 33 are disposed parallel to the drain electrode 31 and the source electrodes 32. The gate electrode 33 may have stacked metals of nickel (Ni), palladium (Pd), and gold (Au), where those metals may have thicknesses around 0.1 µm, around 50 nm, and around 0.5 µm, respectively, where Ni makes a Schottky contact against the semiconductor stack 18. The gate electrode 33 preferably has a total thickness or height greater than 0.3 µm considering deposition conditions of the respective metals but smaller than 0.7 µm from a viewpoint of stably covering the gate electrode 33 with the second insulating film 22. Two gate electrodes 33 are connected with a gate interconnection 36 that laterally extends in the inactive region A2 along an edge of the active region A1. The gate interconnection 36 connects the semiconductor devices 1A each formed on the substrate 11.

The gate electrode 33 in one end thereof is bent toward the source interconnection 42 in the inactive region A2. Specifically, the gate electrode 33 passes the interface between the active region A1 and the inactive region A2 in a side opposite to the gate interconnection 36 and bends toward the source interconnection 42 at an extended portion 33a thereof. The extended portion 33a of the gate electrode 33 exists outside of the source electrode 32. As shown in FIG. 2B, the extended portion 33a of the gate electrode 33 is put between the inactive region A2 and the source interconnection 42 sandwiching the field plate 34 therebetween.

As shown in FIG. 2A and FIG. 2B, the HEMT 1A of the present embodiment further provides first to third insulating films, 21 to 23, and a field plate 34. The insulating films, 21 to 23, passivate the surface of the semiconductor stack 18 and the electrodes of the drain 31, the source 32, the gate 33, and the field plate 34.

The first insulating film 21, which covers the semiconductor stack 18 exposed between the electrodes of the drain 31, the source 32, and the gate 33, provides at least three openings within which the surface of the semiconductor stack 18 exposes, where the openings are a drain opening, a source opening, and a gate opening. The drain electrode 31 fills the drain opening, the source electrode 32 fills the source opening, and the gate electrode fills the gate opening. The electrodes of the drain 31, the source 32, and the gate 33 may be in direct contact with the surface of the semiconductor stack 18 in the respective openings. The gate opening has a length along a direction connecting the drain electrode 31 with the source electrode 32 of 0.4 µm, that is, the HEMT has a gate length of 0.4 µm. The first insulating film 21, which may be an inorganic material containing silicon (Si), typically, silicon nitride (SiN) with a thickness around 50 nm.

The second insulating film 22, which is provided on the first insulating film 21, covers the electrodes of the drain 31, the source 32, and the gate 33. The second insulating film 22 has openings, 22c and 22d, on the drain electrode 31 and the source electrode 32, through which the drain interconnection 41 and the source interconnection 42 are formed. The drain interconnection 41 may be in contact with the drain electrode 31 through the opening 22c, while, the source interconnection 42 may be in contact with the source electrode 32 through the opening 22d.

The second insulating film 22 provides a portion 22a that covers the gate electrode 33 and another portion 22b existing between the gate electrode 33 and the drain electrode 31, where the former portion 22a is provided on and above the gate electrode 33, while, the latter portion is provided above the active region A1 between the gate electrode 33 and the drain electrode 31. Two portions, 22a and 22b, form a step originating to the existence of the gate electrode 33. The second insulating film 22 may be also made of inorganic material containing Si, typically SiN with a thickness of 0.4 to 0.6 µm, where the embodiment has the second insulating film 22 with a thickness of 0.5 µm.

The third insulating film 23, which is provided on the second insulating film 22, covers the drain interconnection 41 and the source interconnection 42. The third insulating film 23 may be made of also inorganic material containing Si, typically SiN preferably having a thickness of 0.1 µm. The third insulating film 23 may prevent the drain interconnection 41 and the source interconnection 42 from being short-circuited and oxidized.

The field plate 34 may be made of stacked metals of, for instance, titanium (Ti) and gold (Au) from a side of the substrate 11. The field plate 34 of the present embodiment provides two parts. As shown in FIG. 1, one of the parts, which is denoted by sparsely dotted areas 34a in FIG. 2A and FIG. 2B, may extend above the gate electrode 33, while, another part, which is denoted as densely dotted areas 34b in FIG. 2A and FIG. 2B, extend to an area between the gate electrode 33 and the drain electrode 31. Also, as shown in FIG. 2A, the field plate 34 in a first part 34a thereof overlaps with the gate electrode 33, while, in a second part 34b thereof not overlapping with the gate electrode 33 extends on the second insulating film 22 between the gate electrode 33 and the drain electrode 41. The first part 34a preferably has a width narrower than 2 µm. The field plate 34 is covered with the third insulating film 23 to prevent the field plate 34 from oxidization thereof.

The field plate 34 may electrically shield the gate electrode 33 from the drain electrode 31 and weaken the electric field concentrated at an edge of the gate electrode 33. The field plate 34 preferably has a thickness smaller than that of the gate electrode 33. For instance, the field plate 34 in the first metal thereof in contact with the second insulating film 22, which may be made of titanium (Ti), has a thickness of 5 nm to 30 nm, typically, 10 nm; while the second metal provided above the first metal, which may be made of gold (Au), preferably has a thickness of 0.1 µm to 0.3 µm, typically 0.2 µm.

The field plate 34 in one end thereof in the side opposite to the gate interconnection 36 extends into the inactive region A2 protruding from the active region A1, bends thereat in substantially 90°, and extends in an area outside of the end of the source electrode 32. That is, the respective parts, 34a and 34b, of the field plate 34 each exist in the area outside of the source electrode 32 in the inactive region A2.

The first part 34a, which overlaps with the gate electrode 33 interposing the second insulating film 22a against the gate electrode 33, also protrudes from the active region A1 into the inactive region A2, bends thereat in 90° toward the source electrode 32, and comes in contact with the source interconnection 42 thereat.

Also, the second part 34b of the field plate 34, which covers a portion of the second insulating film 22b between the gate electrode 33 and the drain electrode 31, extends beyond the active region A1 into the inactive region A2 outside of the source electrode 32 so as to surround the first part 34a of the field plate 34; then, comes in contact with the source interconnection 42 thereat. Thus, even when the first part 34a and the second 34b are physically isolated by a step formed in the second insulating film 22 originating from the thickened gate electrode 33; both parts, 34a and 34b, are commonly connected with the source interconnection 42 at the outside of the source electrode 32 in the inactive region A2.

The field plate 34 preferably has a width W2, which is a total width of the first part 34a and the second part 34b, in the inactive region A2 outside of the source electrode 42, that is greater than a width W1, which is also a total width of the first and second parts, 34a and 34b, in the active region A1. The width W1 may be, for instance 0.5 to 2.0 µm, which is 1.0 µm in the present embodiment, while, the width W2 may be, for instance, 0.5 to 10 µm, which is 3.0 µm in the present embodiment.

Next, a process of forming the semiconductor device 1A according to embodiment of the present invention will be described. FIG. 3A to FIG. 6A are plan views; while, FIG. 3B to FIG. 6B are cross sectional views of the semiconductor device shown in FIG. 1 at respective steps of the process of forming the semiconductor device 1A, where the cross sectional views are taken along the respective lines indicated in drawings corresponding thereto.

Figure 3A:
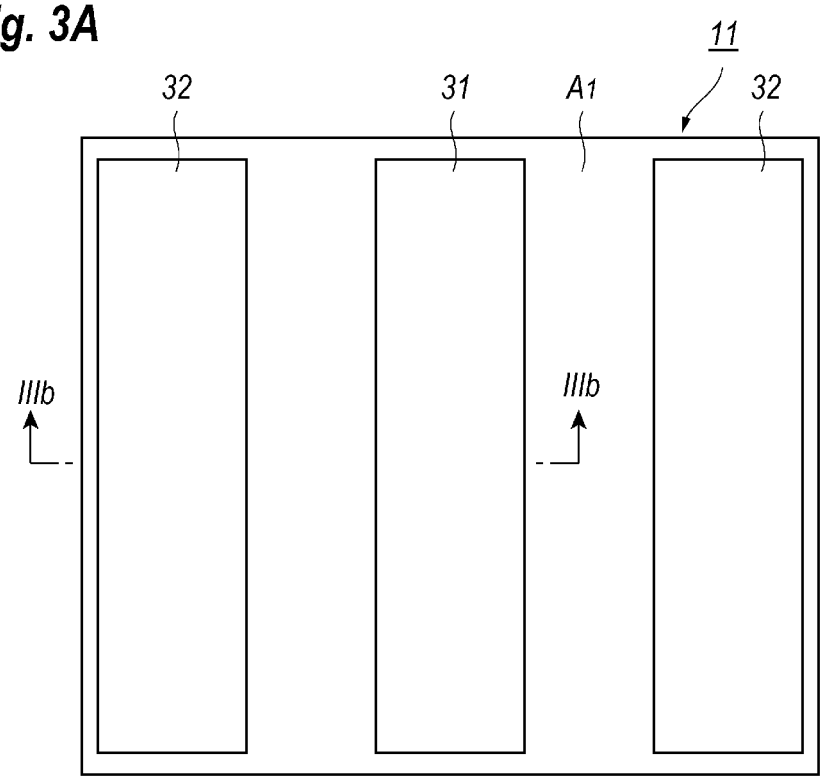
FIG. 3A is a plan view and FIG. 3B is a cross sectional view of the semiconductor device shown in FIG. 1 at a process of forming the same, where
Figure 3B:
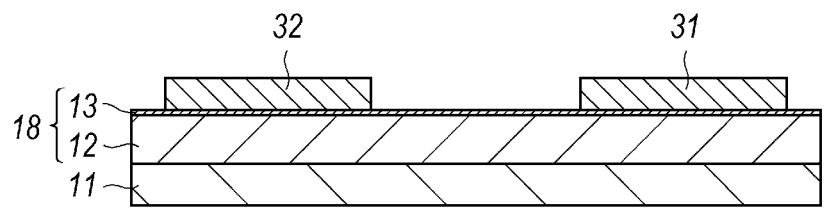

The process first prepares a semiconductor stack 18 by sequentially and epitaxially growing nitride semiconductor layers including a channel layer 12 and a barrier layer 13 on a substrate 11. The metal organic chemical vapor deposition (MOCVD) technique may easily grow the semiconductor layers. Thereafter, the semiconductor stack 18 is divided into the active region A1 and the inactive region A2. Specifically, covering an area to be converted into the active region A1 with a mask, ion implantation of, for instance, argon (Ar$^+$) ions into a rest area not covered with the mask may form the inactive region A2 surrounding the active region A1. Thereafter, the electrodes of the drain 31 and the source 32 may be formed on the active region A1. As shown in FIG. 3A, the drain electrode 31 and the source electrode 32 have a rectangular plane shape.

Figure 4A:
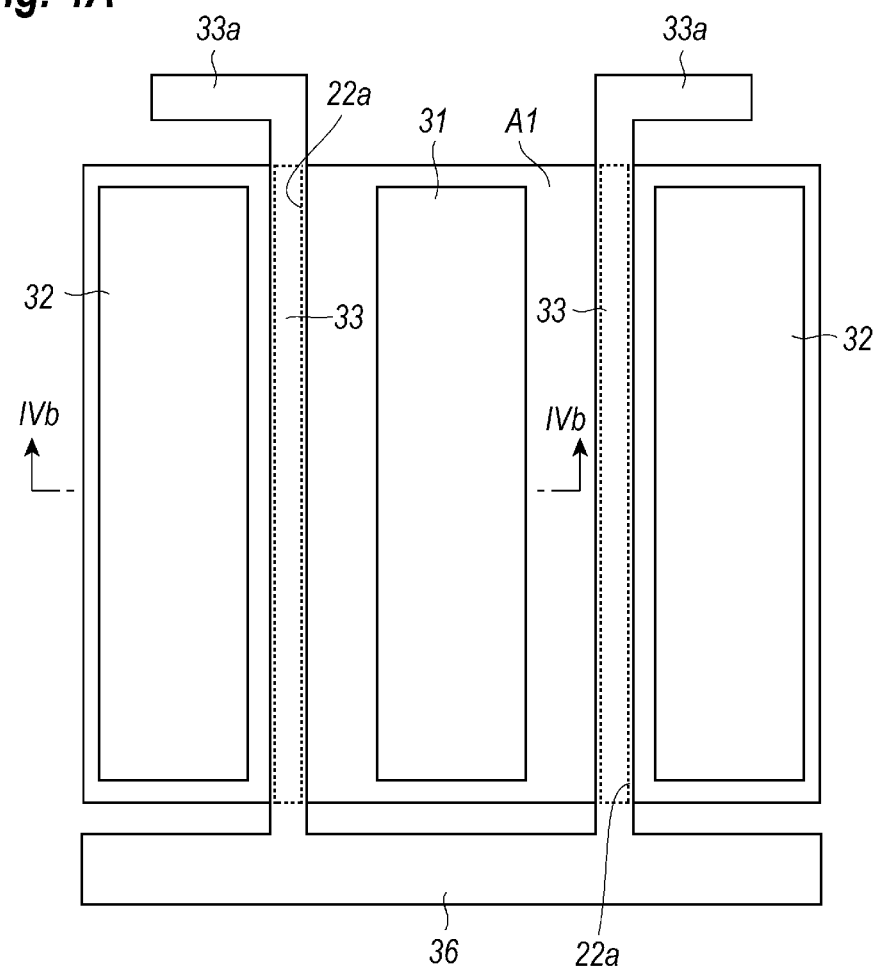
FIG. 4A is a plan view and FIG. 4B is a cross sectional view of the semiconductor device shown in FIG. 1 at a process of forming the same, where
Figure 4B:
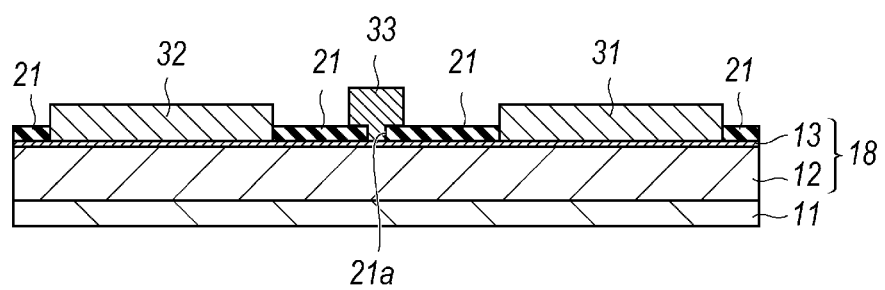

Thereafter, the drain electrode 31, the source electrode 32, and other areas exposing from the electrodes, 31 and 32, are fully covered with a first insulating film 21, where the first insulating film 21 may be formed by a chemical vapor deposition technique. In an alternative, the first insulating film 21 is first deposited on the semiconductor stack 18; then, openings in the first insulating film 21 are formed. The electrodes of the drain 31 and the source 32 are formed in the semiconductor stack 18 so as to fill the openings. Then, an opening 21a namely, a gate opening, is formed in the first insulating film 21 to exposed the surface of the semiconductor stack 18 therein, and the gate electrode 33 is deposited so as to fill the gate opening 21a and partly extend on the first insulating film 21 around the gate opening 21a, as shown in FIG. 4B. In the present embodiment, as shown in FIG. 4A, the gate electrode 33 protrudes from the active region A1 and bends toward the source electrode 32 in the inactive region A2 to form the extended portion 33a thereat. Thus, the extended portion 33a of the gate electrode 33 exists outside of the source electrode 32 in the inactive region A2, and the gate electrode 33 in the extended portion 33a thereof is in direct contact with the semiconductor stack 18 but causes no effect for an operation of the semiconductor device 1A because the extended portion 33a exists in the inactive region A2.

Figure 5A:
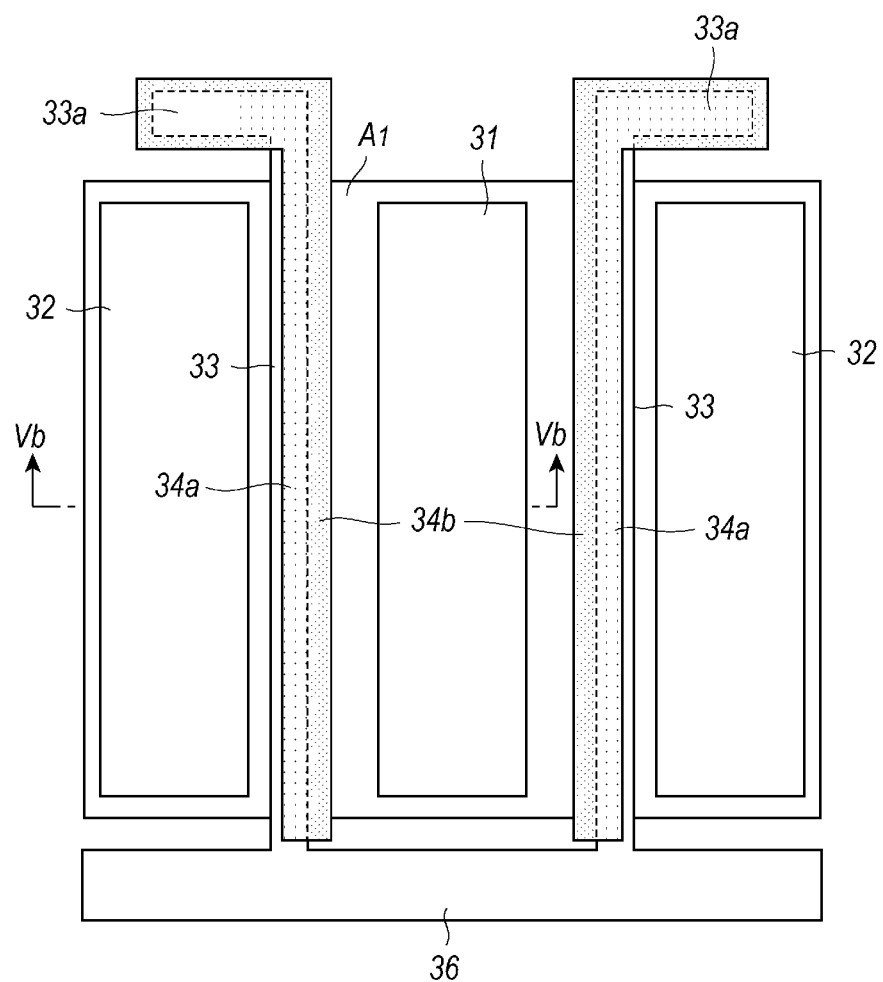
FIG. 5A is a plan view and FIG. 5B is a cross sectional view of the semiconductor device shown in FIG. 1 at a process of forming the same, where
Figure 5B:
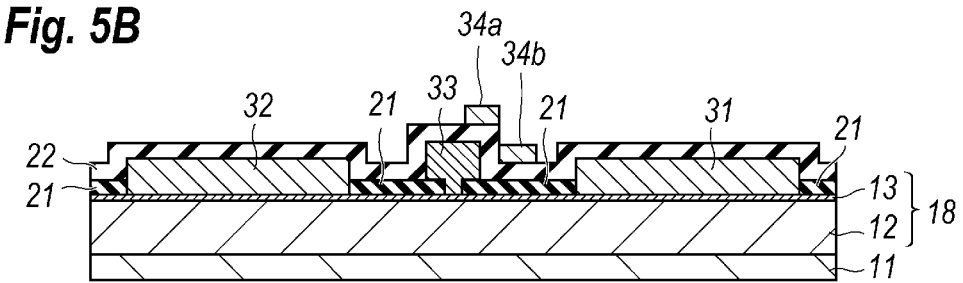

Thereafter, as shown in FIG. 5A and FIG. 5B, the second insulating film 22 covers the electrodes of the drain 31, the source 32, and the gate 33, where the second insulating film 22 may be deposited by the CVD technique. Thereafter, the process forms the field plate 34. Specifically, a patterned photoresist is first prepared on the second insulating film 22, which is not illustrated in the figure, where the patterned photoresist has an opening corresponding to the field plate 34. The opening in the photoresist combines an area for the first part 34a with another area for the second part 34b Depositing metals on the second insulating film 22 and on the patterned photoresist, and removing residual metals accumulated on the patterned photoresist, only the first and second parts, 34a and 34b, of the field plate 34 may be left on the second insulating film 22, which is often called as the lift-off process. As shown in FIG. 5B, the first part 34a denoted as sparsely dotted areas overlapping with the gate electrode 33 is physically isolated from the second part 34b denoted as densely dotted areas in FIG. 5A because of the existence of the step in the second insulating film 22.

Figure 6A:
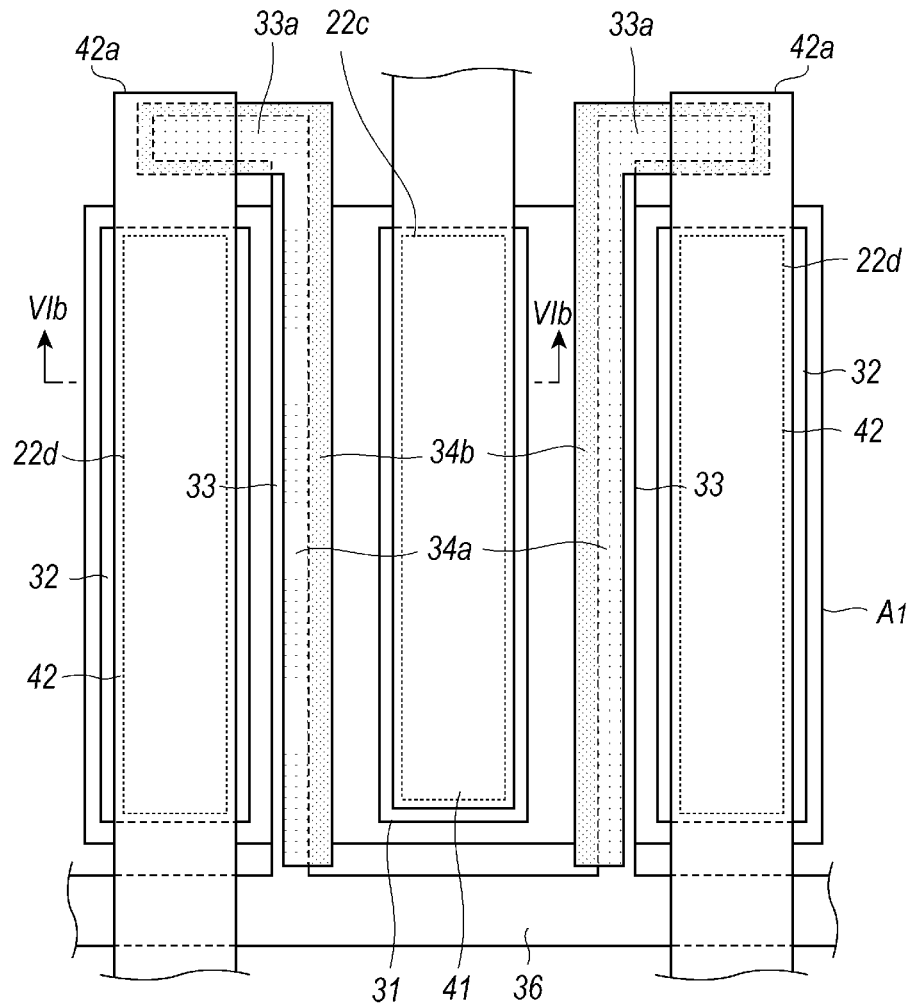
FIG. 6A is a plan view and FIG. 6B is a cross sectional view of the semiconductor device shown in FIG. 1 at a process of forming the same, where
Figure 6B:
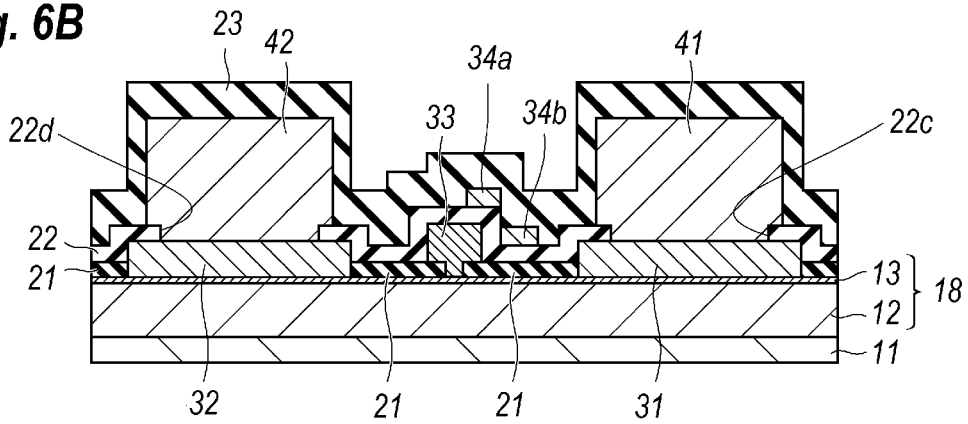

Thereafter, as shown in FIG. 6A and FIG. 6B, the process exposes the electrodes of the drain 31, the source 32, and the gate 33 by forming respective openings, 22c and 22d, in the second insulating film 22. Then, the interconnections of the drain 41 and the source 42 are formed by plating gold (Au). The drain interconnection 41 extends toward one side of the active region A1 opposite to the gate interconnection 36; while, the source interconnection 42 extends toward the side of the gate interconnection 36. In addition, the source interconnection 42 also extends across the edge of the source electrode 32 in the side of the drain interconnection 41 and protrudes within the inactive region A2 outside of the source electrode 32. Then, the source interconnection 42 may be in contact with both of the first part 34a and the second part 34b of the field plate 34 thereat. Accordingly, the first and second parts, 34a and 34b, may be in physically contact with the source interconnection 42 although the first and second parts, 34a and 34b, are physically isolated within the active region A1 due to a steep step formed in the second insulating film 22. Finally, covering the interconnections of the drain 41, the source, 42, the gate 36, and the first and second parts, 34a and 34b, of the field plate 34 by the third insulating film 23, which may be formed by the CVD process, the semiconductor device 1A of the present embodiment may be completed.

Figure 8A:
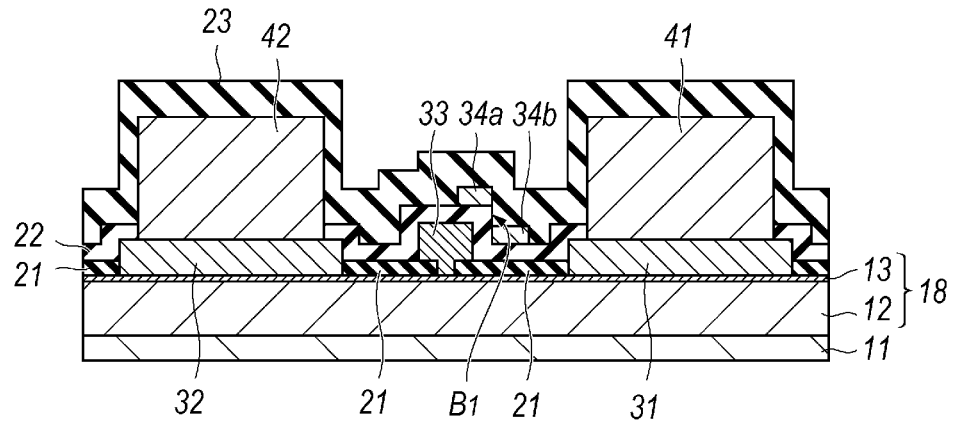
FIG. 8A to FIG. 8C are cross sectional views of the conventional semiconductor device shown in FIG. 7, where
Figure 8B:
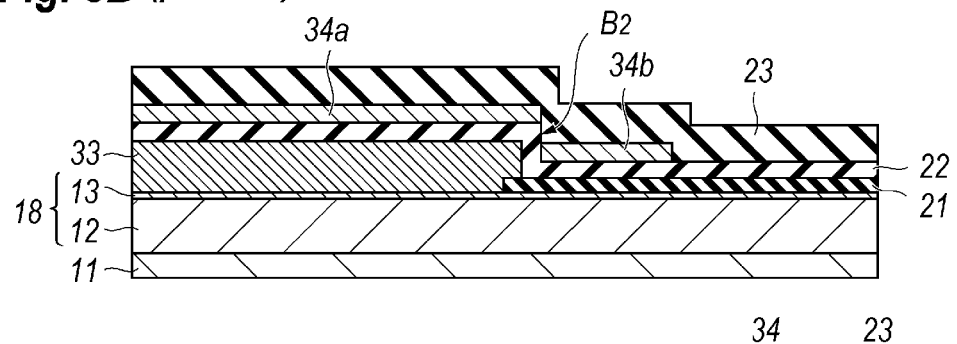
Figure 8C:
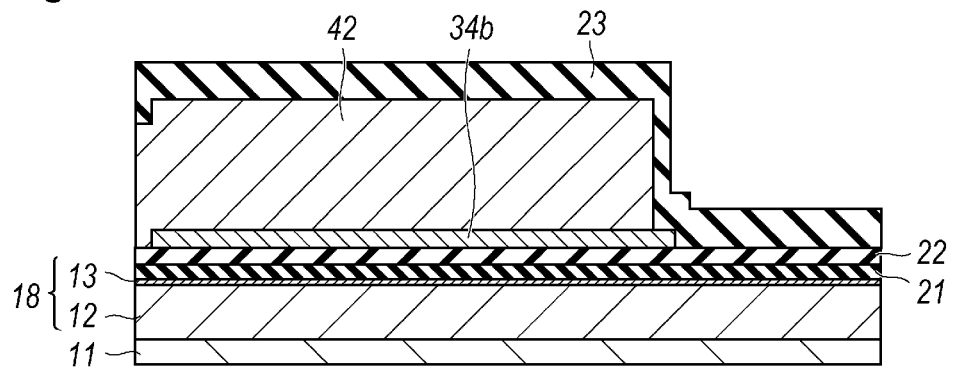

The advantages of the semiconductor device 1A and the process of forming the same will be described comparing with a conventional semiconductor device shown in FIG. 7, which is a plan view of the conventional semiconductor device 100; and FIG. 8A to FIG. 8C are cross sectional views of the conventional device 100 taken along the lines, VIIIa-VIIIa, VIIIb-VIIIb, and VIIIc-VIIIc, indicated in FIG. 7, respectively. FIG. 7 omits the insulating films, 21 to 23.

A field plate is generally formed by, for instance, a vacuum evaporation of metals to easily remove residual metals accumulating on a photoresist, which makes hard to cover sides of a gate electrode, or a side of the step in the second insulating film 22 reflecting a great thickness of gate metals by the metals for the field plate. The gate electrode is necessary to be formed thick in order to reduce gate resistance thereof, while, the field plate may be formed thin because no current flows therein and the resistance thereof becomes ignorable. Accordingly, the step derived from the thickened gate electrode possibly causes breakage of the field plate. The breakage of the field plate above may irregularly occur within the semiconductor device 1A.

Referring to FIG. 7 and FIG. 8A to FIG. 8C, a conventional semiconductor device 100 has no extended portion 33a of the gate electrode 33; that is, only the field plate 34 extends outside of the source electrode 32 and is connected with the source interconnection 42 thereat. When the gate electrode 33, exactly, the step derived from the thickened gate metal possibly leaves a breakage in the gate metal between a portion overlapping with the gate metal and another portion around the gate metal and not overlapping therewith, the former portion is not electrically connected with the source interconnection 42, which degrades the function of the field plate 34, that is, to shield the gate electrode 33 from the drain electrode 31 and to moderate the field strength formed by the gate electrode 33. Also, the breakage of the field plate 34 may change the parasitic capacitance between the gate electrode 33 and the source electrode 32.

The semiconductor device 1A according to the present embodiment prolongs the gate electrode 33 to the outside of the source electrode 32 to form the extended portion 33a thereat, which means that not only the second part 34b but the first part 34a exists in the outside of the source electrode 32 and may be electrically in connect with the source interconnection 42 thereat even when the first part 34a is physically isolated from the second part 34b by the breakage at the step in the second insulating film 22 derived from the thickened gate electrode 33. Accordingly, the field plate 34 may be stably connected with the source electrode 32 and stabilize the electrical potential thereof. The second part 34b of the field plate 34 may be also stably connected with the source electrode 32 as the conventional semiconductor device 100.

The field plate 34 in the outside of the source electrode 32 may preferably have a width W2 along the longitudinal direction of the electrodes, 31 to 33, that is greater than a width W1 along the lateral direction of the electrodes, 31 to 33, which makes the electrical connection between the field plate 34 and the source interconnection 42. Because the extended portion 33a of the gate electrode 33 exists in the inactive region A2 of the semiconductor device 1A, the performance of the semiconductor device 1A, exactly, the current to voltage performance around the gate electrode 33 may receive no influence.

While particular embodiments of the present invention have been described herein for purposes of illustration, many modifications and changes will become apparent to those skilled in the art. For instance, the embodiment described above concentrates of a semiconductor device type of HEMT primarily made of nitride semiconductor materials, the present invention may be applicable to other types of semiconductor device and made of materials except for nitride semiconductor materials. Also, the embodiment concentrates on a semiconductor device having two gate electrodes, and two field plates. However, the invention may be applicable to a device with a single gate electrode with a single field plate, or three or more gate electrodes each accompanying with respective field plates. Accordingly, the appended claims are intended to encompass all such modifications and changes as fall within the true spirit and scope of this invention.

What is claimed is:
1. A semiconductor device, comprising:
a source electrode, a gate electrode, and a drain electrode each extending along a longitudinal direction;
an insulating film covering at least the gate electrode and extending between the gate electrode and the drain electrode;
a field plate having a first part and a second part, the first part overlapping with the gate electrode and interposing the insulating film therebetween, the second part not overlapping with the gate electrode and extending on the insulating film between the gate electrode and the drain electrode; and a source interconnection electrically connected with the source electrode and extending therefrom, wherein the first part and the second part of the field plate are electrically connected with the source interconnection, and wherein the first part and the second part of the field plate are physically isolated from each other.

2. The semiconductor device according to claim 1, further including an active region and an inactive region surrounding the active region, the source electrode, the drain electrode, and the gate electrode existing in the active region, wherein the gate electrode has an extended portion in a region outside of the source electrode in the inactive region, the extended portion being covered with the first part of the field plate and surrounded by the second part, and wherein the field plate in the first part and the second part thereof is in contact with the source interconnection in the region outside of the source electrode.

3. The semiconductor device according to claim 2, wherein the source electrode and the drain electrode have a rectangular plane shape in the longitudinal direction, and wherein the field plate has a width along the longitudinal direction in the region outside of the source electrode that is wider than a width along a lateral direction intersecting the longitudinal direction in an area between the source electrode and the gate electrode.

4. The semiconductor device according to claim 1, wherein the gate electrode has a thickness of 0.3 to 0.7 µm, and the field plate has a thickness of 0.1 to 0.3 µm.

5. The semiconductor device according to claim 1, wherein the insulating film has a thickness of 0.1 to 0.3 µm.

6. The semiconductor device according to claim 1, wherein the source interconnection has a thickness of 4 to 6 µm.

* * * * *